United States Patent
Behun et al.

(10) Patent No.: US 8,044,512 B2
(45) Date of Patent: Oct. 25, 2011

(54) ELECTRICAL PROPERTY ALTERING, PLANAR MEMBER WITH SOLDER ELEMENT IN IC CHIP PACKAGE

(75) Inventors: J. Richard Behun, Essex Junction, VT (US); David B. Stone, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/491,438

(22) Filed: Jun. 25, 2009

(65) Prior Publication Data

US 2010/0327405 A1 Dec. 30, 2010

(51) Int. Cl.
*H01L 23/48* (2006.01)
*H01L 23/52* (2006.01)
*H01L 29/40* (2006.01)

(52) U.S. Cl. ........ 257/737; 257/738; 257/779; 257/780; 257/781; 257/E23.021; 257/E23.068; 257/E23.069

(58) Field of Classification Search .......... 257/737–738, 257/779–781, E23.021, E23.068, E23.069
See application file for complete search history.

(56) References Cited

U.S. PATENT DOCUMENTS

| | | | |
|---|---|---|---|
| 3,787,718 A | 1/1974 | Patterson | |
| 5,367,437 A | 11/1994 | Anderson | |
| 5,551,627 A * | 9/1996 | Leicht et al. | 228/180.22 |
| 5,808,853 A | 9/1998 | Dalal et al. | |
| 5,998,825 A | 12/1999 | Ochiai | |
| 6,005,777 A | 12/1999 | Bloom et al. | |
| 6,297,559 B1 * | 10/2001 | Call et al. | 257/778 |
| 6,336,262 B1 | 1/2002 | Dalal et al. | |
| 6,836,011 B2 * | 12/2004 | Azuma | 257/700 |
| 6,854,636 B2 * | 2/2005 | Farooq et al. | 228/180.22 |
| 6,940,168 B2 * | 9/2005 | Garrity et al. | 257/738 |
| 7,009,412 B2 * | 3/2006 | Chong et al. | 324/754.14 |
| 7,030,432 B2 * | 4/2006 | Ma | 257/254 |
| 7,218,007 B2 * | 5/2007 | Shi et al. | 257/778 |
| 2004/0108364 A1 * | 6/2004 | Ference et al. | 228/180.22 |
| 2004/0140547 A1 * | 7/2004 | Yamazaki et al. | 257/686 |
| 2004/0229398 A1 * | 11/2004 | Magerlein et al. | 438/106 |
| 2007/0075430 A1 * | 4/2007 | Suh et al. | 257/762 |
| 2008/0284018 A1 * | 11/2008 | Chainer | 257/738 |
| 2009/0236735 A1 * | 9/2009 | Corisis et al. | 257/723 |
| 2010/0072603 A1 * | 3/2010 | Boon et al. | 257/690 |

FOREIGN PATENT DOCUMENTS

JP 2001291637 A 10/2001

* cited by examiner

*Primary Examiner* — Ida M Soward
(74) *Attorney, Agent, or Firm* — David A. Cain; Hoffman Warnick LLC

(57) ABSTRACT

A structure includes a solder element for electrically coupling a substrate of an integrated circuit (IC) chip package and a printed circuit board (PCB); and a first electrical property altering, substantially planar member positioned between the solder element and at least one of a landing pad of the substrate and a landing pad of the PCB. In another embodiment, the electrical property altering, planar member can be applied to the solder element(s) between the IC chip and the package substrate.

20 Claims, 7 Drawing Sheets

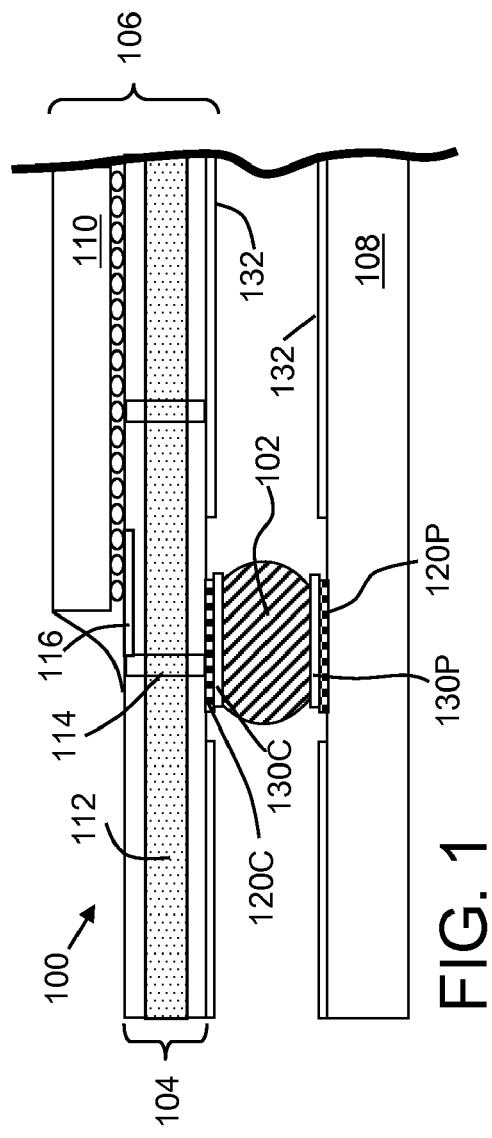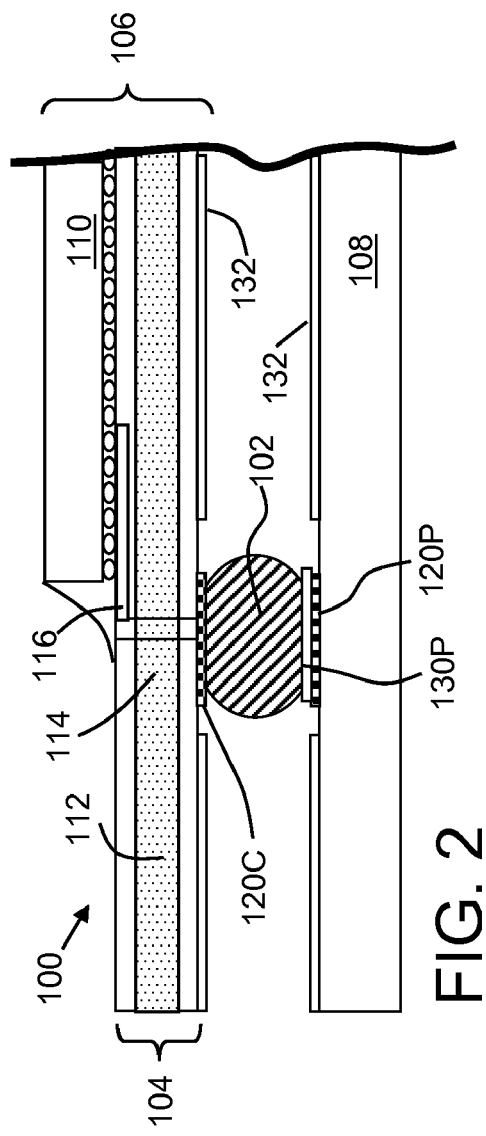

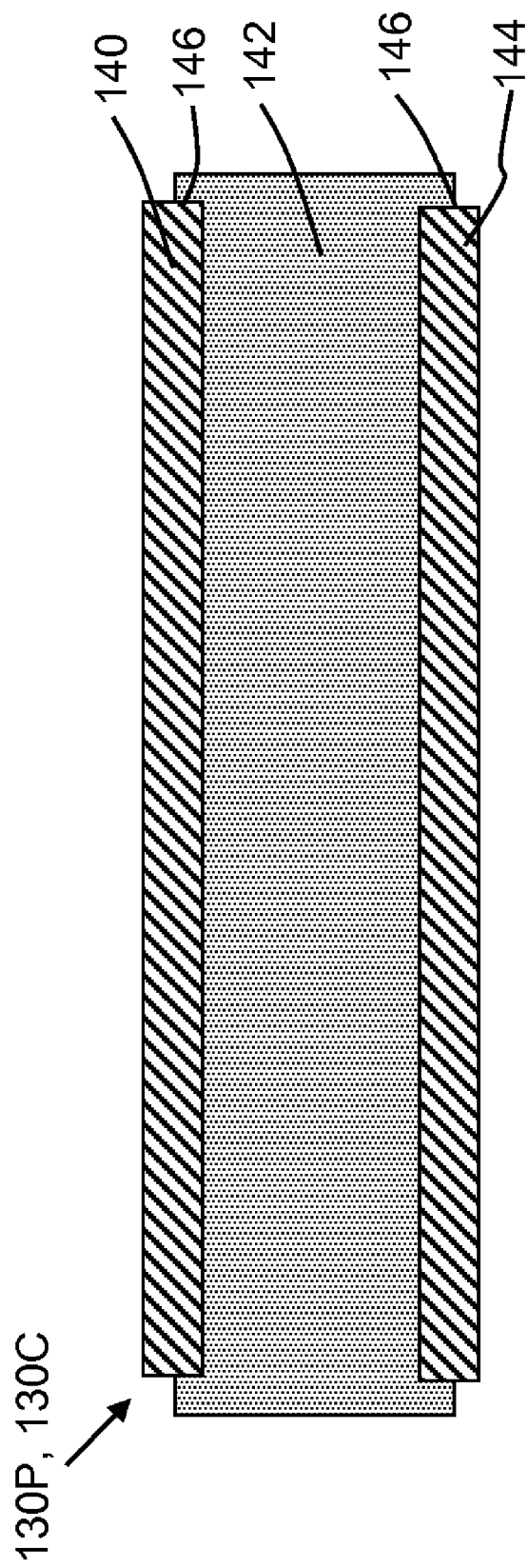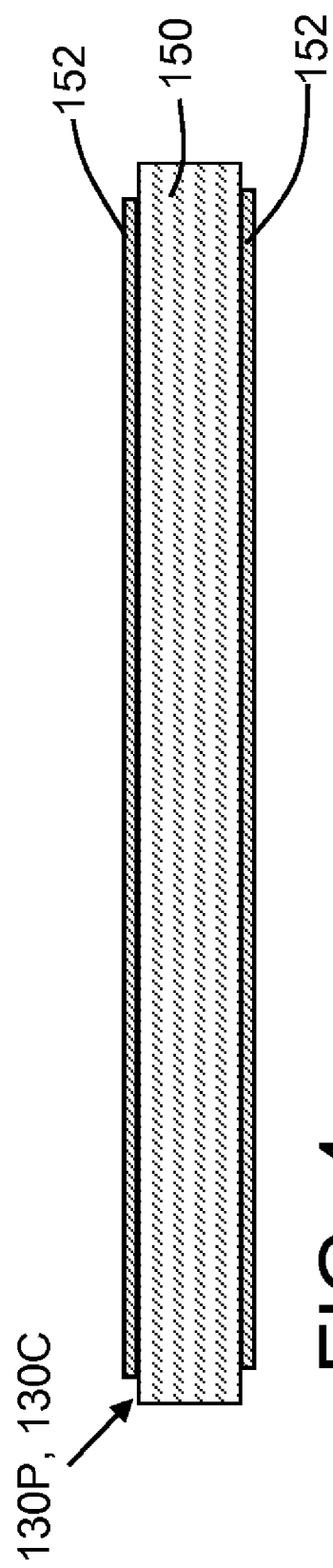

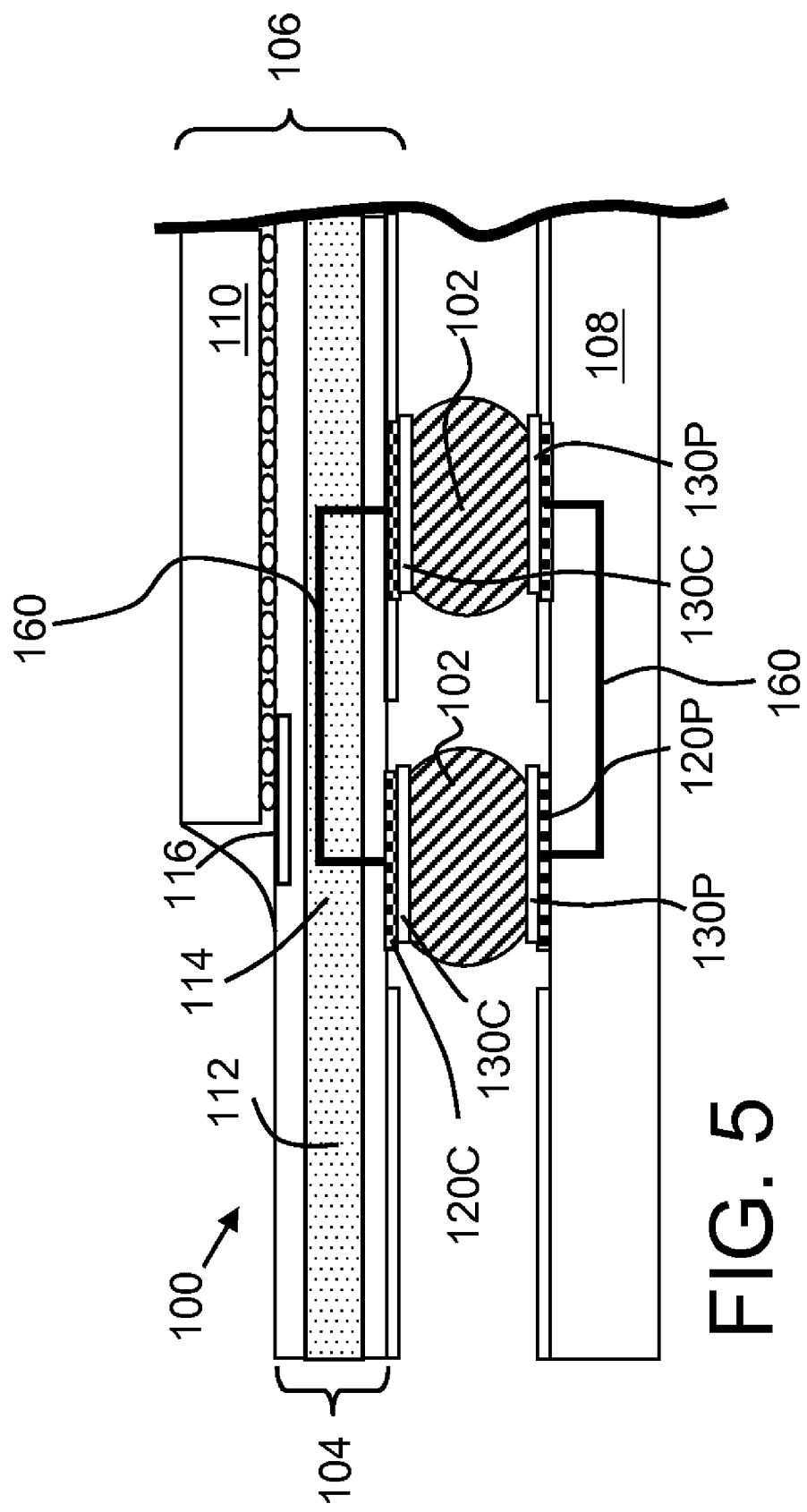

ELECTRICAL PROPERTY ALTERING, PLANAR MEMBER WITH SOLDER ELEMENT IN IC CHIP PACKAGE

BACKGROUND

1. Technical Field

The disclosure relates generally to integrated circuit (IC) packaging, and more particularly, to a structure including an electrical property altering, planar member with a solder element of an IC chip package.

2. Background Art

In integrated circuit (IC) packaging, a ball grid array (BGA) connection is formed by application of solder paste to the landing pad on the laminate substrate, placement of a solder ball upon the paste, and reflow of the subsequent structure. Alternatively, a solder element may lay upon the landing pad which has been coated with solder flux and the solder ball is reflowed upon the landing pad. In these IC packages, high speed differential pair signals (e.g., an HSS operating at 10-Gb/s) oftentimes require a direct current (DC) filter in order to allow the high speed alternating current (AC) signal to pass without detrimental effects such as DC noise from the system or from the communication with other modules operating at a different potential. DC filtering is typically provided by discrete surface mount technology capacitors (d-caps) placed in series of the signal line. This type of filtering, however, is not always possible because it requires a certain amount of space that may not be available, causes a disruption of the differential coupling, and may require additional wiring in the Z direction which adds to coupled noise problems.

BRIEF SUMMARY

A first aspect of the disclosure provides a structure comprising: a solder element for electrically coupling a substrate of an integrated circuit (IC) chip package and a printed circuit board (PCB); and a first electrical property altering, substantially planar member positioned between the solder element and one of a landing pad of the substrate and a landing pad of the PCB.

A second aspect of the disclosure provides an integrated circuit (IC) chip package comprising: an IC chip positioned on a substrate; a lead wire extending from the IC chip; a printed circuit board (PCB); and an electrical property altering, substantially planar member electrically coupling the lead wire to the PCB.

A third aspect of the disclosure provides a method comprising: providing a substrate for mounting an IC chip, the substrate including a first array of connectors on a surface thereof, providing a printed circuit board (PCB), the PCB including a second array of connectors on a surface thereof, creating a landing pad on each connector of the first and second arrays; creating a mask over a selected one of the first and second arrays, the mask including a selected number of openings, each opening revealing a landing pad; forming an electrical property altering, substantially planar member in each opening and on a respective landing pad; removing the mask; creating a ball grid array (BGA) over the selected one of the first and second arrays; and electrically coupling the substrate and the PCB using the ball grid array.

A fourth aspect of the invention includes a structure comprising: a solder element for electrically coupling an integrated circuit (IC) chip and a package substrate therefor; and a first electrical property altering, substantially planar member positioned between the solder element and at least one of a landing pad of the IC chip and a landing pad of the package substrate.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a partial cross-sectional view of an IC chip package coupled to a PCB including a structure according to embodiments of the invention.

FIG. 2 shows a partial cross-sectional view of an IC chip package coupled to a PCB including a structure according to an alternative embodiment.

FIG. 3 shows a cross-sectional view of an electrical property altering, planar member according to embodiments of the invention.

FIG. 4 shows a cross-sectional view of an electrical property altering, planar member according to an alternative embodiment.

FIG. 5 shows a partial cross-sectional view of an IC chip package coupled to a PCB including a structure according to an alternative embodiment.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 6:
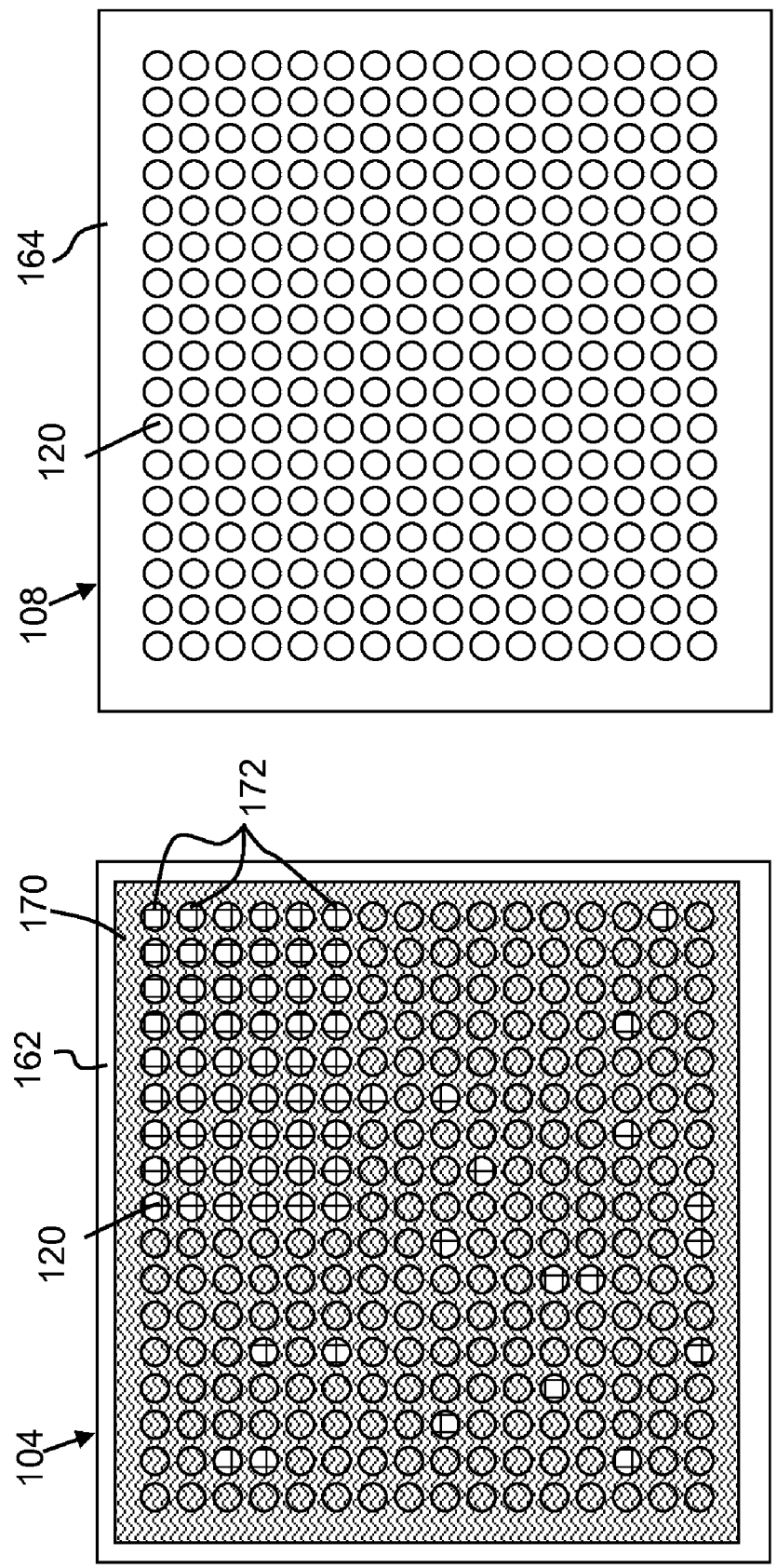
FIG. 6 shows a mask over an IC chip package substrate or PCB for selectively creating openings for formation of the member.

As indicated above, the disclosure provides a structure including an electrical property altering, planar member for between a solder element and a landing pad of an integrated circuit (IC) chip package and/or a printed circuit board (PCB). FIG. 1 shows embodiments of a structure 100 including a solder element 102 for electrically coupling a substrate 104 of an IC chip package 106 and PCB 108. As appreciated by one with skill in the art, the drawings are simplified for clarity and do not include such things as underfill, thermal interface materials, a chip lid, adhesives, surface mount devices, build-up layers, solder masks, etc. In addition, only one solder element 102 is shown for clarity although an array of solder elements is typically provided (see FIGS. 6-7). Solder element 102 may include any solder connection such as a solder ball (as shown), solder column, post, gull wing, lead, etc. Substrate 104 may include any now known or later developed laminate material, ceramic or other materials typically used for mounting and scaling up an IC chip 110. Some details of substrate 104 that are illustrated include a core 112, a number of plated through holes (PTH) 114 and wiring 116. PCB 108 may include any flat board that holds electronic components in layers that interconnect via conductive pathways (traces, not shown).

Each area of substrate 104 or PCB 108 at which an electrical connection is desired to exit therefrom has a solder element 102 coupled thereto via a respective landing pad 120C, 120P. Landing pad 120C indicates use interconnection with IC chip package 106 and landing pad 120P indicates interconnection with PCB 108. Each landing pad 130C, 130P may include a solder wettable pad that acts as an electrical connection between solder element 102 and electrical pathways in substrate 104 or PCB 108, respectively. Landing pad 130C, 130P may also be referred to as ball limiting metallurgy (BLM) and may include, for example, an adhesive layer such as chromium (Cr) or titanium tungsten (TiW), and a solder reflowable layer such as copper (Cu) or nickel (Ni). Solder element 102 may include a lead/tin (Pb/Sn) alloy (or Pb-free such as SnCu, SnAgCu) that aids in reducing the reaction between the copper in landing pad 120 and the tin (Sn). The size of landing pad 120 is configured to provide reliable mechanical, electrical and thermal stability.

In addition to the above-described conventional features, structure 100 also includes an electrical property altering, substantially planar member 130C, 130P positioned between solder element 102 and at least one of landing pad 120C of substrate 104 and landing pad 120P of PCB 108, respectively. FIG. 1 shows an embodiment in which an electrical property altering, substantially planar member 130P, 130C (hereinafter simply "member") is used between solder element 102 and both substrate 104 and PCB 108. That is, a first member 130C is positioned between solder element 102 and landing pad 120C of substrate 104 and a second member 130P is positioned between solder element 102 and landing pad 120P of PCB 108. FIG. 2 shows an embodiment in which only member 130P is used between solder element 102 and PCB 108. It is understood that member 130C (FIG. 1) may likewise be used without member 130P. In any event, member 130C, 130P is external to an external surface 132 of substrate 104 or PCB 108.

Member 130P, 130C is substantially planar so as to minimize vertical space requirements. The electrical property that member 130P, 130C alters may vary depending on the structure of the member. Member 130C and/or 130P may include any form of material capable of achieving the desired electrical effect, e.g., a unitary material or a series of layers of materials. In one embodiment, electrical property altering, planar member 130C and/or 130P may include a capacitor. In this case, as shown in FIG. 3, member 130P and/or 130C may include a first metal layer 140 separated by a dielectric 142 from a second metal layer 144. Metal layers 140, 144 may include a conductor such as but not limited to copper, nickel, aluminum, etc., and dielectric 142 may include an insulator such as but not limited to silicon nitride, silicon dioxide, a polyimide, etc. In one embodiment, dielectric 142 may extend over edges 146 of first metal layer 140 and second metal layer 144 so as to prevent shorting between the layers. However, this may not be necessary in all cases. As a capacitor, member 130C, 130P acts as a DC filter, allowing the AC signal to pass while filtering out the lower frequency (DC) fluctuations. In another embodiment, planar member 130C and/or 130P may include a resistor or an inductor. In this case, as shown in FIG. 4, member 130C, 130P may include one or more layers 150 of a material that can create the desired electrical effect such as an insulator that may include but is not limited to: silicon nitride, silicon dioxide, a polyimide, etc. Furthermore, as shown in FIG. 4 only, each member 130C, 130P may include a solder-wettable layer 152 on a surface that interfaces with landing pad 120 and a surface that interfaces with solder element 102. Each solder-wettable surface is arranged to not extend to an edge of the member.

FIG. 5 shows an alternative embodiment in which at least one of solder elements 102 of a plurality of solder elements includes a member 130C and/or 130P (all shown with both). In this case, however, an electrical connection 160 is made between solder elements 102 in at least one of substrate 104 and PCB 108 to create a parallel connection between two or more of solder elements 102 and members 130P, 130C. In this fashion, members 130P, 130C can be coupled in parallel to obtain a desired alteration of an electrical property. It is understood that any number of solder elements 102 may be coupled in this fashion.

Figure 7:
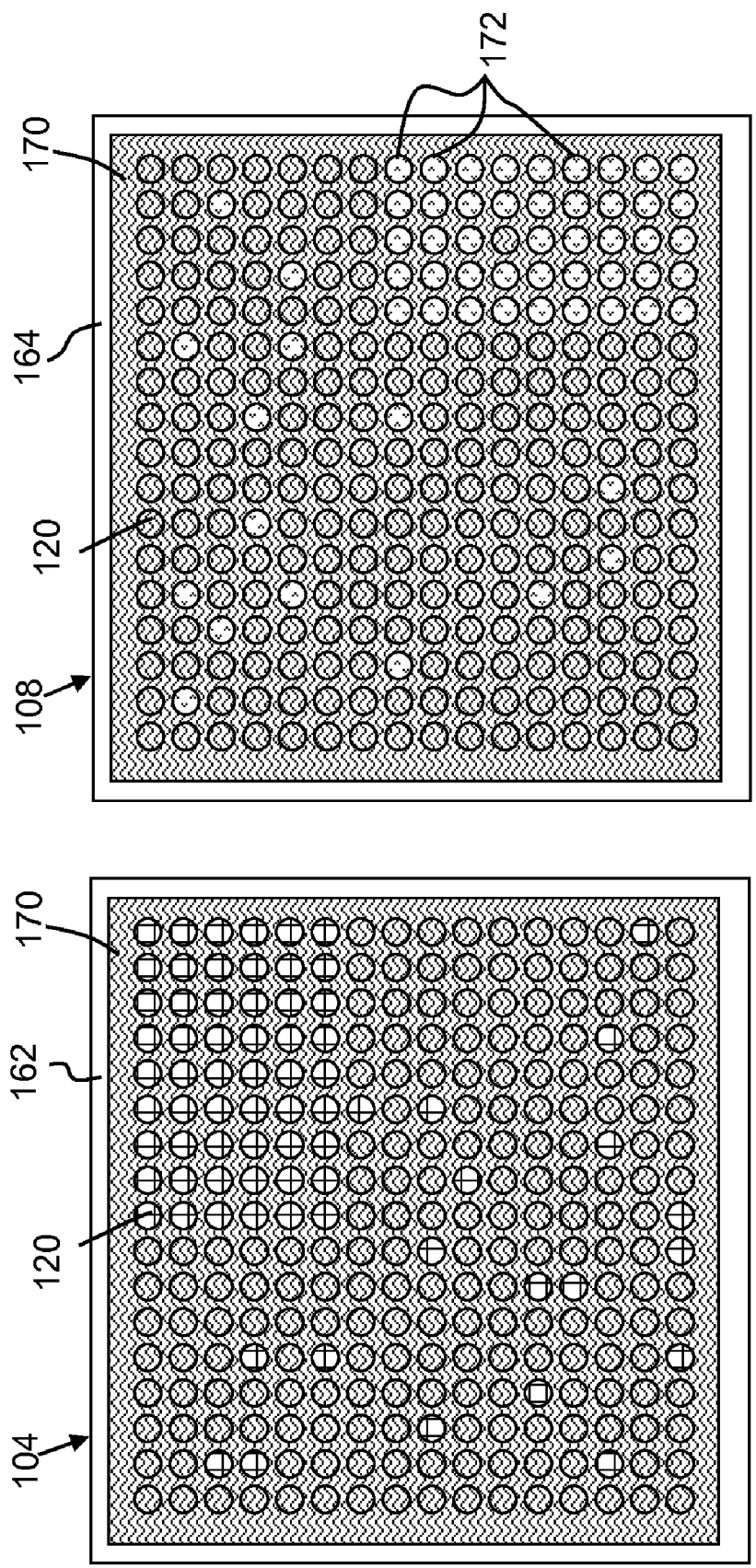
FIG. 7 shows a pair of masks over an IC chip package substrate and PCB for selectively creating openings for formation of the member.

In one embodiment, each solder element 102 in a ball grid array may include one or more members 130C, 130P. (Where a ball grid array is used, it may take any now known or later developed form such as a flip chip plastic ball grid array (FC-PBGA), an enhanced plastic ball grid array (EPBGA), a ceramic ball grid array (CBGA), a ceramic column grid array (CCGA), or others including wire bond packages such as gull wing, fine pitch ball grid array (FBGA), chip scale packaging including such products as Tessera® packages, etc.) Alternatively, although a plurality of solder elements 102 may be employed, in another embodiment, only selective ones of the solder elements 102 may include a member 130C, 130P. In this case, as shown in FIGS. 6 and 7, a substrate 104 for holding an IC chip 110 (IC chip 110 may or may not be coupled at this stage) may be provided, where substrate 104 includes a first array of connectors (under landing pads 120) on a surface 162 thereof. Similarly, PCB 108 may include a second array of connectors (under landing pads 120) on a surface 164 thereof. Landing pads 120 may be formed on each connector of the first and second arrays in any now known or later developed manner. As shown in FIG. 6, a mask 170 may then be formed over a selected one of the first and second arrays (substrate 104 as shown), the mask including a selected number of openings 172 (different shading than mask, not all labeled) where each opening 172 reveals a landing pad 120. Mask 170 may include any now known or later developed mask material. A member 130P, 130C (FIGS. 1-2) may then be formed in each opening 172 and on a respective landing pad 120 using any now known or later developed processing. Member 130P, 130C may be formed using any now known or later developed techniques such as deposition of materials, adhesion of material, soldering, subtractive etching, etc. Mask 170 may then be removed using any now known or later developed etching process, e.g., a reactive ion etch. A BGA (solder elements 102) may then be formed over a selected one of the first and second arrays in a known fashion, and substrate 104 and PCB 108 may be electrically coupled using the ball grid array. In this manner, a designer can selectively apply any electrical property alteration to desired electrical paths between chip package 106 and PCB 108.

In an alternative embodiment, shown in FIG. 7, a mask 170 may be created over both the first and second arrays (i.e., substrate 104 and PCB 108), each mask including a selected number of openings 172 and each opening revealing a landing pad 120. Members 130C, 130P (FIGS. 1-2) may then be formed in each opening 172, and both masks removed. In either embodiment, members 130C, 130P may be tested prior to coupling of substrate 104 and PCB 108.

Figure 8:
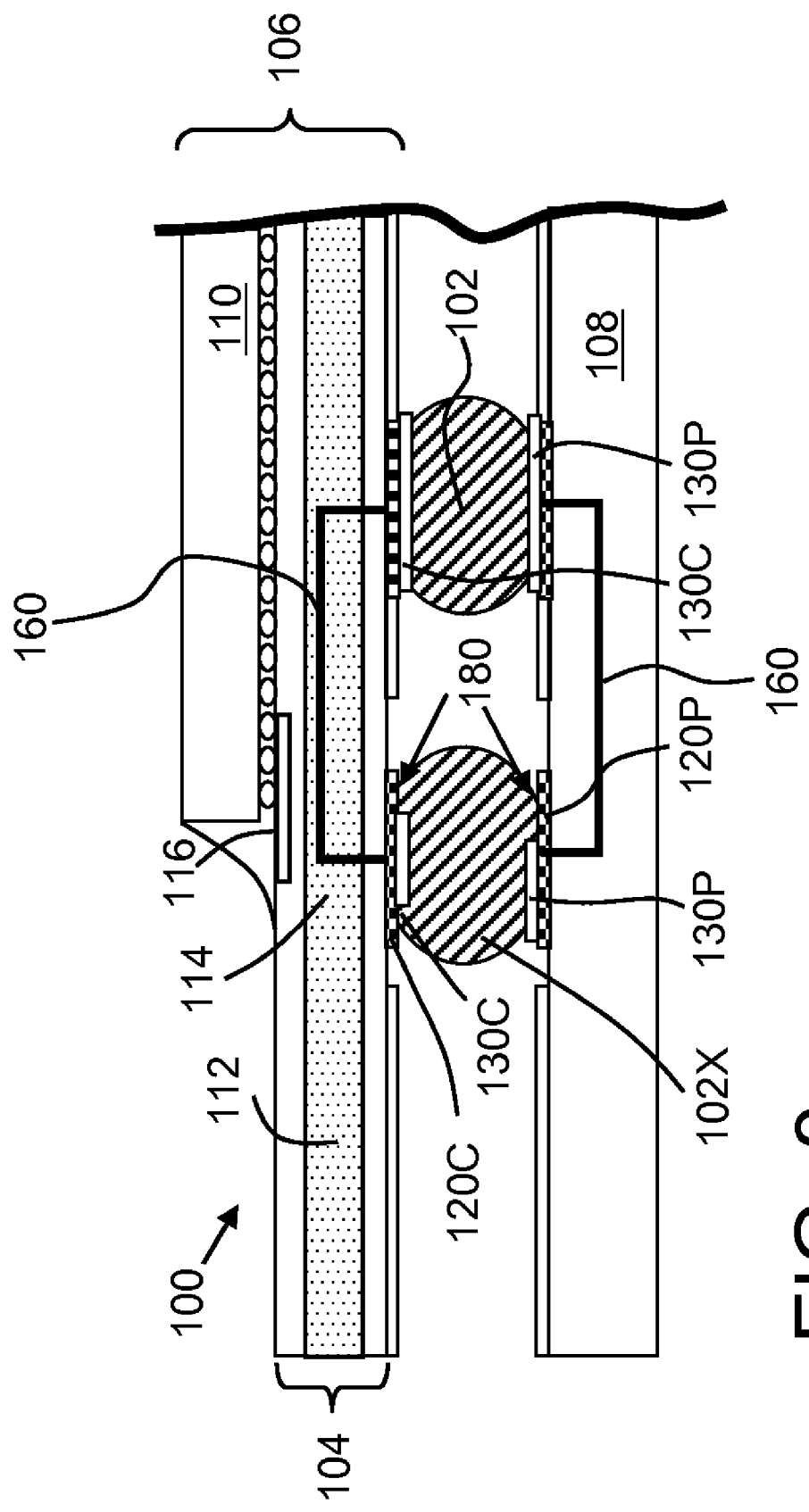
FIG. 8 shows a partial cross-sectional view of an IC chip package coupled to a PCB including a structure according to an alternative embodiment.

In another alternative embodiment, shown in FIG. 8, all of solder elements 102 within an array may have member 130C and/or member 130P formed thereon. In this case, a selected solder element may have a short 180 about its member 130C, 130P or, if both are provided as shown, set of members 130C, 130P. In this manner, member(s) 130C, 130P become electrically transparent. Member(s) 130C, 130P may be shorted in any now known or later developed fashion, e.g., by having solder element 102 with sufficient volume so as to extend about one or both members, by thermal processing to cause a short through the members, etc. This process may ease manufacturing complexity and provide a cost advantage.

Member 130P, 130C, as described herein, presents no physical design differences to chip package 110 whether it is used or not. In addition, substrate 104 can be tested with the member 130C in place prior to committing the substrate to the joining of IC chip 110 and prior to joining to PCB 108. The additional thickness of the physical structure is very minimal, such that use of existing solder elements and solder volumes are not affected regardless of whether the landing pad has member 130C and/or 130P or it is omitted.

Figure 9:
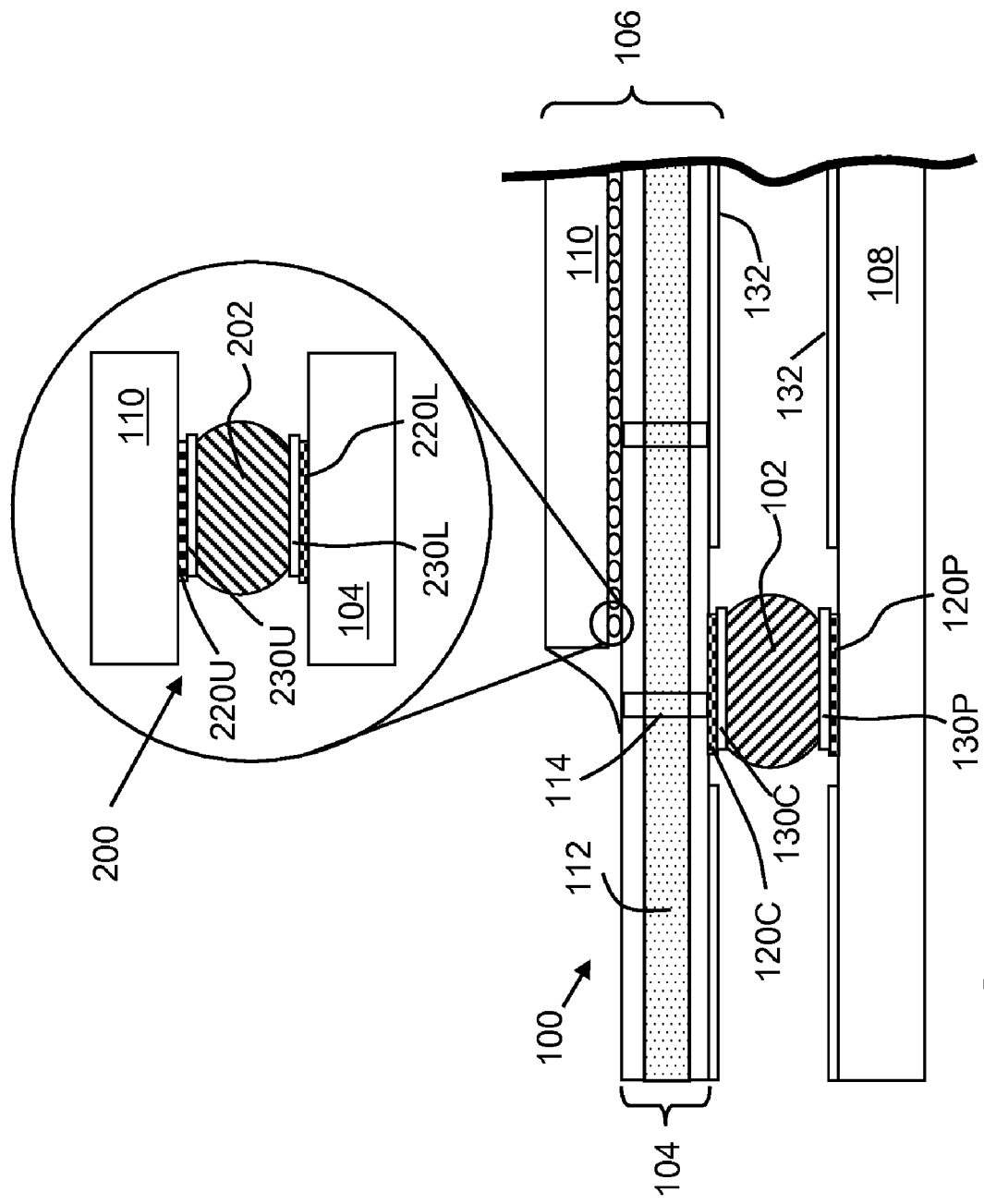
FIG. 9 shows a partial cross-sectional view of an IC chip coupled to a substrate package therefor including a structure according to an alternative embodiment.

Referring to FIG. 9, another embodiment, which may be employed separate from, or in combination with, the above embodiments, is illustrated. In this embodiment, the above teachings are applied to a solder element(s) 202 between IC chip 110 and package substrate 104. That is, between the silicon of IC chip 110 and package substrate 104, solder element(s) 202 take the form of, for example, a controlled collapse chip connector (C4) array including a plurality of solder elements. In this case, a structure 200 includes a solder element 202 for electrically coupling IC chip 110 and a package substrate 104 therefor, and a first electrical property altering, substantially planar member 230U, 230L positioned between solder element 202 and at least one of a landing pad 220U of IC chip 110 and a landing pad 220L of package substrate 104. FIG. 9 shows two members 230U, 230L, but only one may be employed. As above, member(s) 230U, 230L may take the form of a capacitor, a resistor or an inductor. Where member(s) 230U, 230L include a capacitor, they may include a first metal layer separated by a dielectric from a second metal layer, as described relative to FIGS. 3-4.

The structure and methods as described above are used in the fabrication of integrated circuit chip packages. The above-described teachings can be applied to a single chip package (such as a plastic carrier, with leads that are affixed to a motherboard or other higher level carrier) or in a multichip package (such as a ceramic carrier that has either or both surface interconnections or buried interconnections). In any case the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram or sequence of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
   a solder element for electrically coupling a substrate of an integrated circuit (IC) chip package and a printed circuit board (PCB), wherein the solder element is part of one of: a flip chip plastic ball grid array (FC-PBGA), an enhanced plastic ball grid array (EPBGA), a ceramic ball grid array (CBGA), a ceramic column grid array (CCGA), or a fine pitch ball grid array (FBGA);
   a first electrical property altering, substantially planar member positioned between the solder element and a landing pad of the substrate; and
   a second electrical property altering, substantially planar member positioned between the solder element and a landing pad of the PCB.

2. The structure of claim 1, wherein the first electrical property altering, substantially planar member includes a capacitor.

3. The structure of claim 2, wherein the capacitor includes a first metal layer separated by a dielectric from a second metal layer.

4. The structure of claim 3, wherein the dielectric extends over edges of the first metal layer and the second metal layer.

5. The structure of claim 1, wherein the first electrical property altering, substantially planar member includes a resistor.

6. The structure of claim 1, wherein the first electrical property altering, substantially planar member includes an inductor.

7. The structure of claim 1, wherein the solder element is part of a ball grid array including a plurality of solder elements.

8. The structure of claim 1, wherein the solder element includes a plurality of solder elements, at least one of the solder elements including the first electrical property altering, substantially planar member positioned between the respective solder element and the one of the landing pad of the substrate and the landing pad of the PCB.

9. The structure of claim 8, further comprising a short through the first and second electrical property altering, substantially planar members of at least one selected solder element so as to make the members electrically transparent.

10. The structure of claim 8, wherein the at least one of the solder elements including the first electrical property altering, substantially planar member includes a plurality of solder elements including an electrical property altering, substantially planar member, and further comprising an electrical connection in at least one of the substrate and the PCB to create a parallel connection between one or more of the solder elements and the plurality of electrical property altering, substantially planar members.

11. The structure of claim 1, wherein the first electrical property altering, substantially planar member is external to an external surface of the substrate or the PCB.

12. The structure of claim 1, wherein the first electrical property altering, substantially planar member includes a solder-wettable layer on a surface that interfaces with the landing pad and a surface that interfaces with the solder element, each solder-wettable surface arranged to not extend to an edge of the member.

13. An integrated circuit (IC) chip package comprising:
    an IC chip positioned on a substrate;
    a lead wire extending from the IC chip;
    a printed circuit board (PCB);
    a solder element for electrically coupling the substrate and the PCB; and
    an electrical property altering, substantially planar member electrically coupling the lead wire to the PCB.

14. The IC package of claim 13, wherein the electrical property altering, substantially planar member includes one of: a capacitor, a resistor and an inductor.

15. The IC package of claim 14, wherein in the case that the electrical property altering, substantially planar member includes the capacitor, the capacitor includes a first metal layer separated by a dielectric from a second metal layer, the dielectric extending over edges of the first metal layer and the second metal layer.

16. The IC package of claim 13, wherein the first electrical property altering, substantially planar member is external to an external surface of the substrate or the PCB.

17. A structure comprising:
    a solder element for electrically coupling an integrated circuit (IC) chip and a printed circuit board (PCB), wherein the solder element is part of one of: a flip chip plastic ball grid array (FC-PBGA), an enhanced plastic ball grid array (EPBGA), a ceramic ball grid array (CBGA), a ceramic column grid array (CCGA), or a fine pitch ball grid array (FBGA);
    a first electrical property altering, substantially planar member positioned between the solder element and a landing pad of the IC chip; and
    a second electrical property altering, substantially planar member positioned between the solder element and a landing pad of the PCB.

18. The structure of claim 17, wherein the first electrical property altering, substantially planar member includes one of a capacitor, a resistor and an inductor.

19. The structure of claim 17, wherein the first electrical property altering, substantially planar member includes a capacitor including a first metal layer separated by a dielectric from a second metal layer.

20. The structure of claim 17, wherein the solder element is part of a controlled collapse chip connector (C4) array including a plurality of solder elements.

\* \* \* \* \*